(12) United States Patent
Cheong et al.

(10) Patent No.: US 9,497,488 B2
(45) Date of Patent: Nov. 15, 2016

(54) CONDITIONAL GOLOMB BASED ADAPTIVE ENTROPY CODING

(71) Applicant: SONY CORPORATION, Tokyo (JP)

(72) Inventors: Hye-Yeon Cheong, Milpitas, CA (US); Ali Tabatabai, Cupertino, CA (US)

(73) Assignee: SONY CORPORATION, Tokyo (JP)

( * ) Notice: Subject to any disclaimer, the term of this patent is extended or adjusted under 35 U.S.C. 154(b) by 232 days.

(21) Appl. No.: 14/323,880

(22) Filed: Jul. 3, 2014

(65) Prior Publication Data

US 2015/0201220 A1    Jul. 16, 2015

Related U.S. Application Data

(60) Provisional application No. 61/925,926, filed on Jan. 10, 2014.

(51) Int. Cl.

| | | |
|---|---|---|
| *H04N 19/91* | (2014.01) | |
| *H04N 7/32* | (2006.01) | |
| *G06K 9/36* | (2006.01) | |
| *H03M 7/00* | (2006.01) | |
| *H04N 19/159* | (2014.01) | |
| *H04N 19/176* | (2014.01) | |
| *H04N 19/13* | (2014.01) | |
| *H04N 19/186* | (2014.01) | |
| *H04N 19/146* | (2014.01) | |

(52) U.S. Cl.
CPC .............. *H04N 19/91* (2014.11); *H04N 19/13* (2014.11); *H04N 19/159* (2014.11); *H04N 19/176* (2014.11); *H04N 19/186* (2014.11); *H04N 19/146* (2014.11)

(58) Field of Classification Search
CPC ....................................................... H04N 19/91
USPC ....................................................... 375/240.23
See application file for complete search history.

(56) References Cited

U.S. PATENT DOCUMENTS

| | | | | |
|---|---|---|---|---|
| 5,475,501 A | * | 12/1995 | Yagasaki | ................ H04N 19/61 375/240.24 |
| 6,198,412 B1 | | 3/2001 | Goyal | |
| 6,665,444 B1 | * | 12/2003 | Kajiwara | ................ G06T 9/007 375/E7.045 |
| 7,199,735 B1 | * | 4/2007 | Wen | ........................ H04N 19/91 341/107 |
| 8,325,819 B2 | | 12/2012 | Karczewicz | |

FOREIGN PATENT DOCUMENTS

| | | |
|---|---|---|
| EP | 1030524 A1 | 8/2000 |
| EP | 2362657 A1 | 8/2011 |

* cited by examiner

*Primary Examiner* — Hee-Yong Kim
(74) *Attorney, Agent, or Firm* — John P. O'Banion (57) ABSTRACT

An apparatus and method for performing variable length coding (VLC) within an adaptive entropy image coding process are presented. VLC is performed using a progressive coding technique, such as progressive Golomb coding (PGC) whose operation is based on a set of parameters. Grouping is performed within image distribution contexts, such as number of quantized bit planes (qn), previous residual, predictor type, and color, so that each group having similar contexts is associated with a set of progressive coding parameters. The grouping can be performed on-line or off-line. In operation, the progressive coding parameters then change in response to changing image distribution contexts toward optimizing image coding, such as increasing peak signal-to-noise ratio (PSNR).

20 Claims, 9 Drawing Sheets

| LUMA | qn=0 | qn=1 | qn=2 | qn=3 | qn=4 | qn=5 | qn=6 | qn=7 |
|---|---|---|---|---|---|---|---|---|
| $R_{t-1} < -3$ | Group 4 | | | | | | | |
| $R_{t-1} = -3$ | | | | | | | | |
| $R_{t-1} = -2$ | Group 3 | | | | Group 1 | | | |
| $R_{t-1} = -1$ | Group 2 | | | | | | | |
| $R_{t-1} = 0$ | | | | | | | | |
| $R_{t-1} = 1$ | | | | | | | | |
| $R_{t-1} = 2$ | Group 3 | | | | | | | |
| $R_{t-1} = 3$ | Group 4 | | | | | | | |
| $R_{t-1} > 3$ | | | | | | | | |

X: Current pixel of interest

| LUMA | qn=0 | qn=1 | qn=2 | qn=3 | qn=4 | qn=5 | qn=6 | qn=7 |
|---|---|---|---|---|---|---|---|---|
| $R_{t-1}<-3$ | Group 4 | | | | | Group 1 | | |
| $R_{t-1}=-3$ | | | | | | | | |
| $R_{t-1}=-2$ | Group 3 | | | | | | | |
| $R_{t-1}=-1$ | Group 2 | | | | | | | |
| $R_{t-1}=0$ | | | | | | | | |
| $R_{t-1}=1$ | | | | | | | | |
| $R_{t-1}=2$ | Group 3 | | | | | | | |
| $R_{t-1}=3$ | Group 4 | | | | | | | |
| $R_{t-1}>3$ | | | | | | | | |

FIG. 7A

| CHROMA | qn=0 | qn=1 | qn=2 | qn=3 | qn=4 | qn=5 | qn=6 | qn=7 |
|---|---|---|---|---|---|---|---|---|
| $R_{t-1}<-3$ | Group 4 | | | | | Group 1 | | |
| $R_{t-1}=-3$ | | | | | | | | |
| $R_{t-1}=-2$ | Group 3 | | | | | | | |
| $R_{t-1}=-1$ | Group 2 | | | | | | | |
| $R_{t-1}=0$ | | | | | | | | |
| $R_{t-1}=1$ | | | | | | | | |
| $R_{t-1}=2$ | Group 3 | | | | | | | |
| $R_{t-1}=3$ | Group 4 | | | | | | | |
| $R_{t-1}>3$ | | | | | | | | |

FIG. 7B

| LUMA | qn=0 | qn=1 | qn=2 | qn=3 | qn=4 | qn=5 | qn=6 | qn=7 |
|---|---|---|---|---|---|---|---|---|
| $R_{t-1}<-3$ | Group 4 | | Group 3 | | | Group 1 | | |
| $R_{t-1}=-3$ | | | | | | | | |
| $R_{t-1}=-2$ | | | | | | | | |
| $R_{t-1}=-1$ | | | | | | | | |
| $R_{t-1}=0$ | | | | | | | | |
| $R_{t-1}=1$ | | | | | | | | |
| $R_{t-1}=2$ | | | | | | | | |
| $R_{t-1}=3$ | | | | | | | | |
| $R_{t-1}>3$ | | | | | | | | |

FIG. 8A

| CHROMA | qn=0 | qn=1 | qn=2 | qn=3 | qn=4 | qn=5 | qn=6 | qn=7 |
|---|---|---|---|---|---|---|---|---|
| $R_{t-1}<-3$ | Group 2 | | | Group 1 | | | | |
| $R_{t-1}=-3$ | | | | | | | | |
| $R_{t-1}=-2$ | | | | | | | | |
| $R_{t-1}=-1$ | | | | | | | | |
| $R_{t-1}=0$ | | | | | | | | |
| $R_{t-1}=1$ | | | | | | | | |
| $R_{t-1}=2$ | | | | | | | | |
| $R_{t-1}=3$ | | | | | | | | |
| $R_{t-1}>3$ | | | | | | | | |

FIG. 8B

CONDITIONAL GOLOMB BASED ADAPTIVE ENTROPY CODING

CROSS-REFERENCE TO RELATED APPLICATIONS

This application claims priority to, and the benefit of, U.S. provisional patent application Ser. No. 61/925,926 filed on Jan. 10, 2014, incorporated herein by reference in its entirety.

STATEMENT REGARDING FEDERALLY SPONSORED RESEARCH OR DEVELOPMENT

Not Applicable

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND

1. Technological Field

The disclosure pertains generally to entropy coding of images using variable length coding (VLC) and more particularly to a conditional progressive VLC coding process.

2. Background Discussion

The use of variable length coding (VLC) is an important technology, such as within image and video coding systems, that provides for compression and decompression in a lossless manner (zero error) while the resultant coded output can still be read back symbol-by-symbol. Using a proper coding strategy that is independent and identically-distributed (i.i.d.) a source may be very close to optimally compressed, that is to say very close to its entropy. This near optimal coding ability of VLC is in contrast to fixed length coding which is better suited for large data blocks.

Figures 1, 2A, 2B:
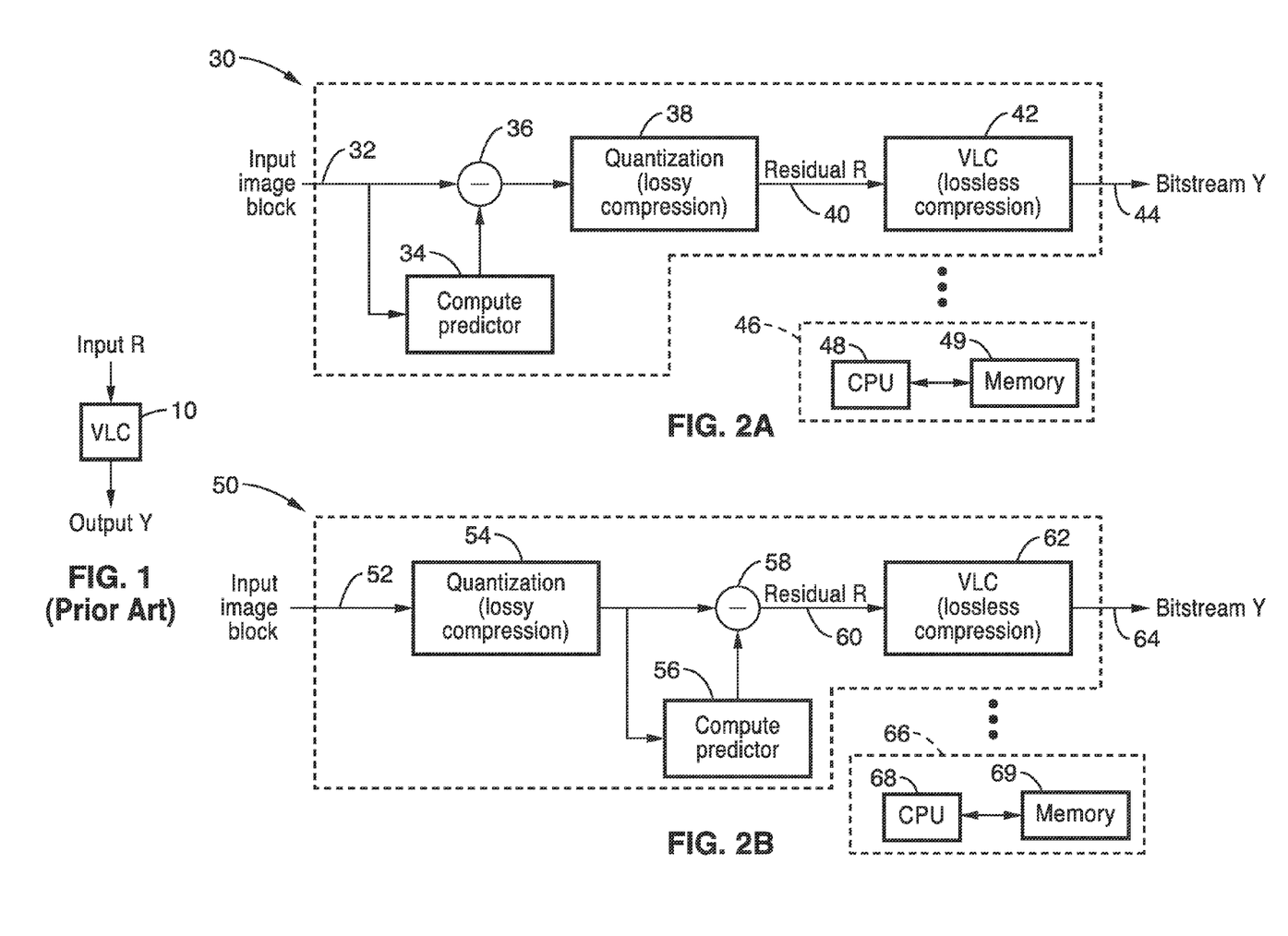
FIG. 1 is a block diagram of general VLC coding in which an input R is VLC coded to an output Y.
FIG. 2A is a schematic block diagram of VLC coding according to a first embodiment of the present technology.
FIG. 2B is a schematic block diagram of VLC coding according to a second embodiment of the present technology.
Figure 3A:
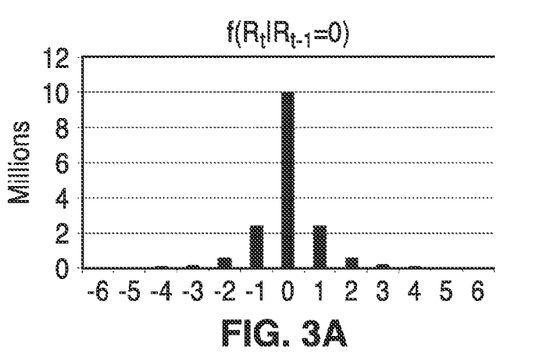
FIG. 3A through FIG. 3K are charts of current residual $f(R_t)$ showing that distribution is dependent on the neighboring residual value $R_{t-1}$.
Figure 3B:
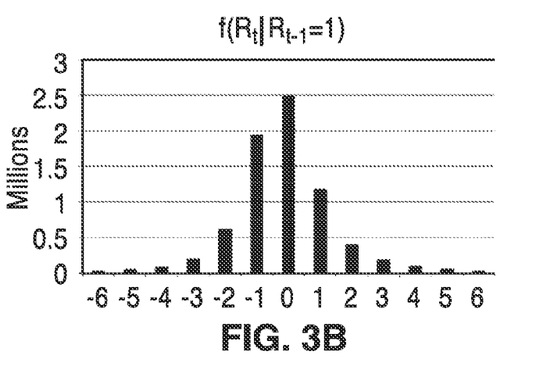
Figure 3C:
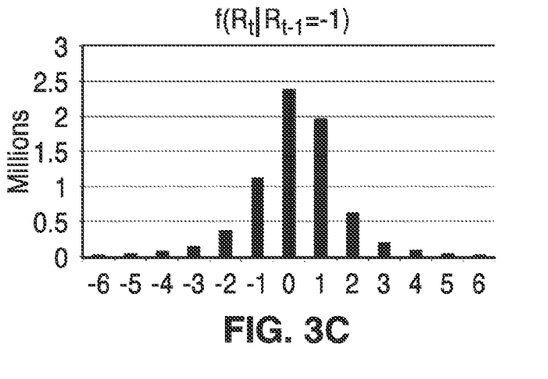
Figure 3D:
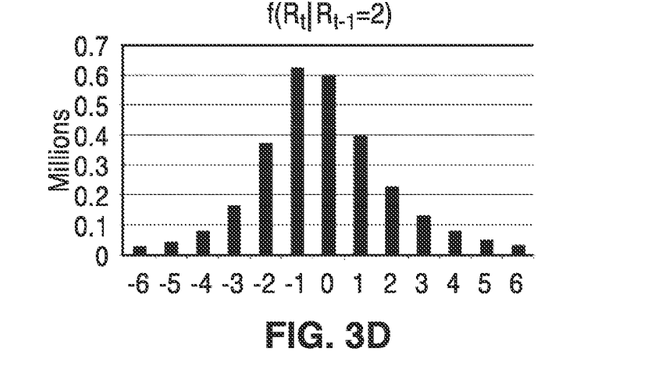
Figure 3E:
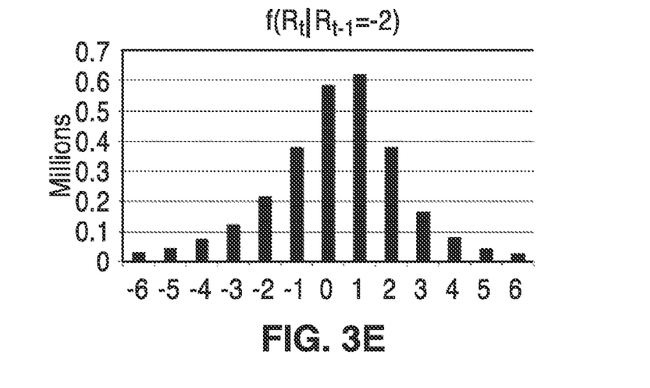
Figure 3F:
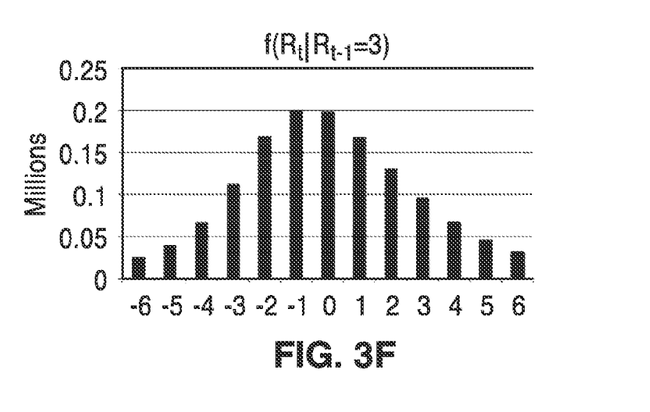
Figure 3G:
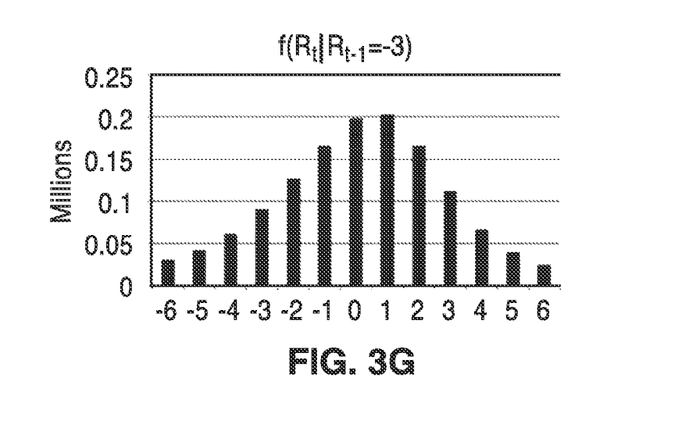
Figure 3H:
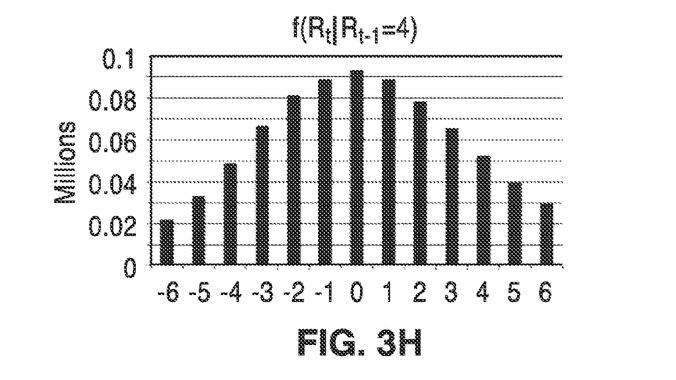
Figure 3I:
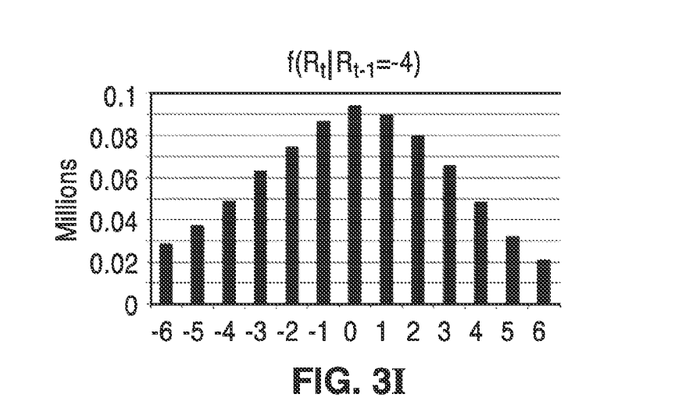
Figure 3J:
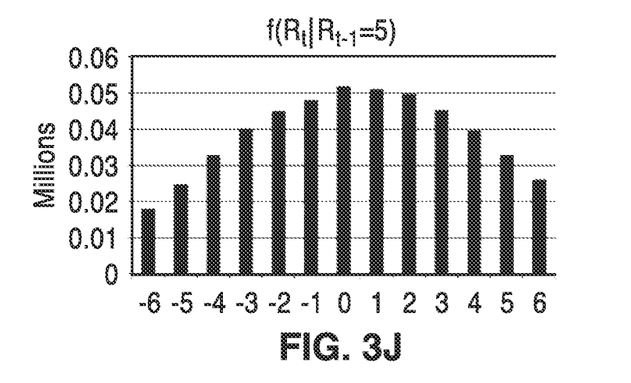
Figure 3K:
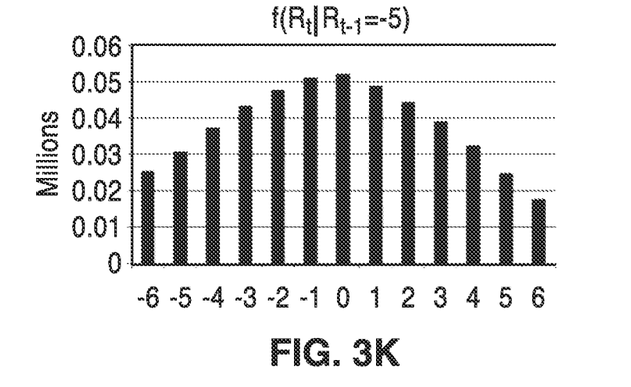

As seen in FIG. 1, VLC 10 maps source symbols of input (R) to a variable number of bits in output (Y), and is designed to compress R to Y with zero error (lossless data compression). It is most beneficial for VLC to be implemented to minimize the average length of Y given the distribution of input R(=f(R)). It will be appreciated that VLC performance is sensitive to f(R). Typically, one single VLC is applied universally to all input R, and is the most efficient approach if f(R) is i.i.d. (independent and identically-distributed).

Accordingly, VLC is an important technology for which ongoing enhancements are sought.

BRIEF SUMMARY

It has been recognized in the presently described technology that VLC performance is sensitive to input distribution, and that existing universal VLC techniques do not fit the input distribution particularly well in practical coding applications. The distribution of the current input changes depending on number of quantized bit-planes (qn), the previous/neighboring residual value, and other contexts.

The present technology describes a conditional VLC (CVLC) which utilizes a form of progressive coding, and according to at least one embodiment, preferably a progressive Golomb coding (PGC), in which parameters are changed for the progressive coding depending on the context. Selecting of optimal PGC parameters for each given context is a process that can be performed on-line or off-line according to different implementations of the present technology.

Further aspects of the technology will be brought out in the following portions of the specification, wherein the detailed description is for the purpose of fully disclosing preferred embodiments of the disclosed technology without placing limitations thereon.

BRIEF DESCRIPTION OF THE SEVERAL VIEWS OF THE DRAWING(S)

The technology will be more fully understood by reference to the following drawings which are for illustrative purposes only.

DETAILED DESCRIPTION

The present disclosure describes a conditional variable length coding (CVLC) method. The present method is based on a number of observations regarding distribution of inputs to VLC.

FIG. 2A and FIG. 2B illustrate example VLC coding embodiments 30, 50, upon which the present technique can be applied. In FIG. 2A is seen a general coding embodiment 30 in which prediction is performed prior to quantization. More particularly, the figure shows an image block being input 32 upon which a predictor is determined 34, and a difference obtained 36 which is quantized 38 to generate a residual R 40, which is VLC coded 42 to output a bitstream Y 44. In FIG. 2B is seen a general coding embodiment 50 in which prediction is performed after quantization. More particularly, the figure shows an image block being input 52 which is quantized 54, then a predictor determined 56, with a difference obtained 58 generating a residual R 60, which is VLC coded 62 to output a bitstream Y 64. It will also be appreciated that the above VLC coding steps may also include performing a transform prior to quantization.

The operations of the coding apparatus described above are preferably performed in response to programming that is configured for storage in at least one memory for execution on at least one processor. By way of example and not limitation, a processor block 46 is shown with computer processor 48 and memory 49 for FIG. 2A, while another processor block 66 is shown with computer processor 68 and memory 69 for FIG. 2B. The processor blocks are considered to execute programming for carrying out the steps of progressive coding within the VLC entropy coding process.

It will be appreciated that in image coding, the prediction residual is the input to the VLC operation. Regardless of which of the above different VLC coding configurations is utilized, the residual distribution f(R) is usually not independent and identically-distributed (i.i.d.), as $f(R_t)$ is often dependent on quantization value (qn), previous or neighboring input $R_{t-1}$, predictor type, color (e.g., Luma, Chroma), and so forth.

FIG. 3A through FIG. 3K illustrate graphs according to a first observation utilized within the present technology. In particular, distribution of the current residual $f(R_t)$ is dependent on the previous or neighboring residual value denoted as $R_{t-1}$. In these example graphs, the residual value of the left sample is used as $R_{t-1}$. It will be appreciated that in using a 1D block it is the previous residual value which is the only available coded neighbor. Of course in a 2D block, there are other available coded neighbors.

The tables show the current residual when the previous residual is within {0, 1, −1, 2, −2, 3, −3, 4, −4, 5, −5, 6, −6}. Absolute residual values beyond a given threshold, such as six for this example, were not depicted in the graphs, as they could be considered to use the same parameters as that utilized for the absolute value of five. It will be noted in these figures that the slope changes and the center shifts in these different examples, showing distribution changes in response to these previous residual values.

Figure 4A:
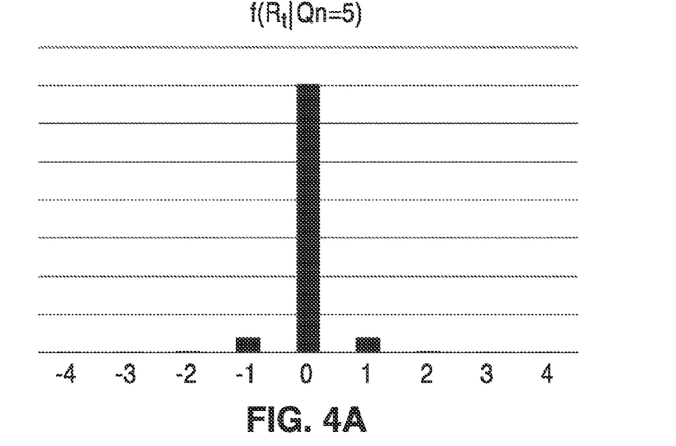
FIG. 4A and FIG. 4B are graphs depicting that distribution of the current residual $f(R_t)$ is dependent on qn (quantization level) value, which is an observation utilized according to an embodiment of the present technology.
Figure 4B:
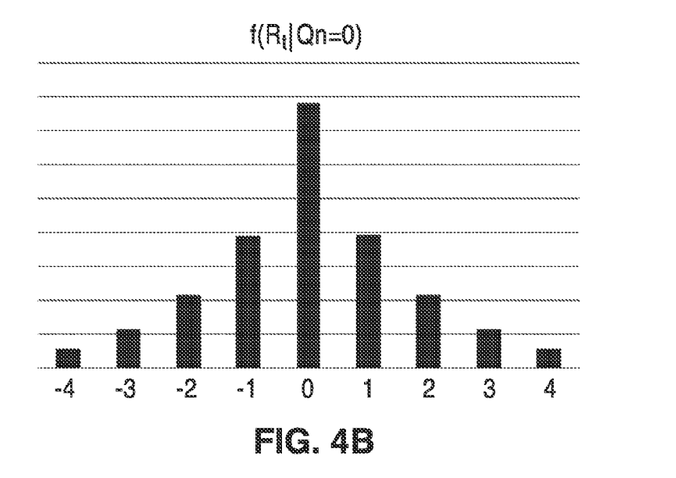

FIG. 4A and FIG. 4B illustrate graphs according to a second observation utilized within the present technology. In particular, the observation is that distribution of the current residual $f(R_t)$ is dependent on quantization level (qn) value. FIG. 4A depicts the current residual when qn is equal to 5, while FIG. 4B depicts the current residual when qn is equal to 0. In comparing these two graphs one can see a significant slope change difference.

It should be appreciated that an encoder may utilize adaptive prediction depending on context. For example, the prediction used in JPEG-LS supports four different predictors which can be selected depending on the context its neighboring pixels).

Figure 5:
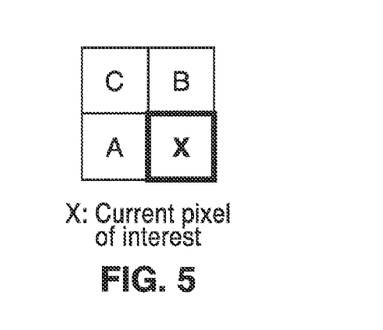
FIG. 5 is a diagram of the current pixel of interest in relation to it nearby neighbors.

FIG. 5 depicts a local pixel neighborhood (context) showing pixels A, B and C in relation to a current pixel of interest X. Four predictors are determined as follows:
Predictor 1: A;
Predictor 2: min(A, B, C);
Predictor 3: max(A, B, C);
Predictor 4: A+B−C.

Figure 6A:
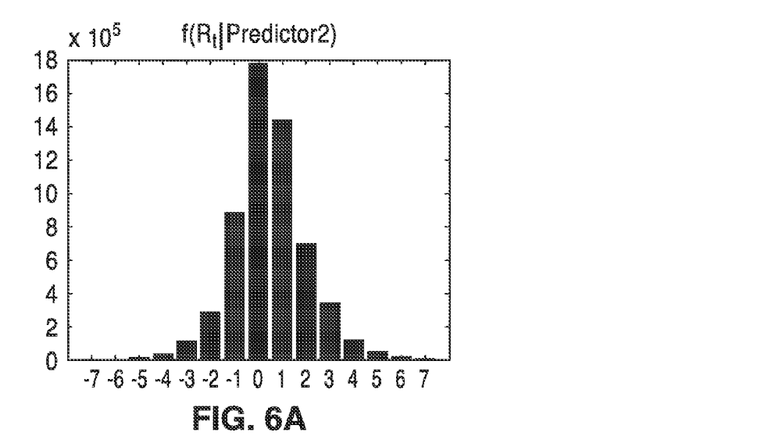
FIG. 6A through FIG. 6C are graphs depicting that use of an adaptive predictor instead of a fixed predictor $f(R_t)$, can also be dependent upon the predictor it uses, which is an observation utilized according to an embodiment of the present technology.
Figure 6B:
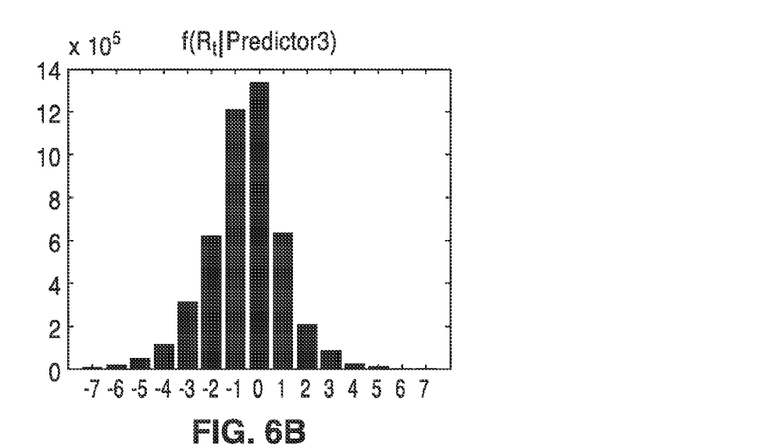
Figure 6C:
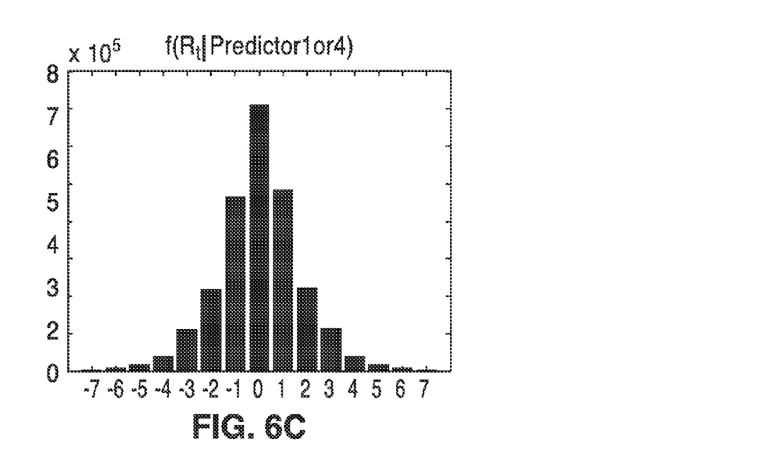

FIG. 6A through FIG. 6C illustrate graphs according to a third observation upon which the present technology is based. In particular, these graphs show that even if an encoder uses an adaptive predictor instead of fixed predictor, the distribution of the current residual $f(R_t)$ can depend on the predictor it uses. The current residual is depicted in response to a second predictor in FIG. 6A, a third predictor in FIG. 6B, and to a first or fourth predictor in FIG. 6C.

In response to the above observations, conditional VLC (CVLC) in this present technology uses a form of progressive coding, and preferably a form of progressive Golomb coding (PGC), whose parameters are conditionally changed depending on the context.

Finding the optimal PGC parameters for a given group of contexts, is a process that can be performed on-line or off-line. For example in one on-line method, small statistics of input are collected on the fly, from which appropriate PGC parameters are computed on the fly (i.e., in real-time). Off-line processing requires less overhead during the encoding process, as groupings are determined based on contexts, and progressive coding parameters selected each of these groups, outside of the actual encoding process. For example in one off-line method, statistics of input are collected for all different contexts, these are then grouped into fewer groups, such that each group has a similar distribution of input. For each group, the optimal PGC parameters are then determined. The groupings and associated PGC parameters are then used during the on-line VLC encoding processing. When the actual coding is performed (an on-line process) a check is made to determine which group the input context belongs to, whereby the associated pre-computed PGC parameters are retrieved for that group and used for VLC.

The off-line method is particularly well-suited for use with complexity conscious applications, such as applications operating on devices having limited processor bandwidth. The context utilized during this off-line process can be selected from the group of contexts consisting of quantization level (qn), previous input value, color (e.g., Chroma or Luma) and predictor type, although other contexts may be utilized without departing from the teachings of the present technology.

Golomb coding provides lossless data compression using a family of data compression codes that are based on geometric distribution. Coding of alphabets following the geometric distribution have a Golomb code as an optimal prefix code, so that Golomb coding is well-suited for data sets in which small values are far more likely than large values. It will be appreciated that progressive Golomb coding (PGC) is a generalized version of Golomb-M coding where the tunable parameter M is not fixed for the entire range of input but can be different for different input regions. PGC allows for improved tuning of the entropy coding for the input distribution than is available with Golomb-M or Exp-Golomb coding.

The technology described herein is preferably performed in response to programming which selects between multiple PGC parameters sets, preferably at least three to four groups, based on grouping of contexts so that each individual group shares a similar distribution trend. In the examples below, the grouping is described according to a table having context axes. It should be appreciated, however, that programming for executing a determination of these multiple/plurality of groups need not rely on executing a table structure, as one of ordinary skill in the art will appreciate that other programmatic mechanisms (e.g., conditional branching, calculations, etc.) can be utilized to arrive at the same grouping results without departing from the teachings of the present technology.

Figure 7A:
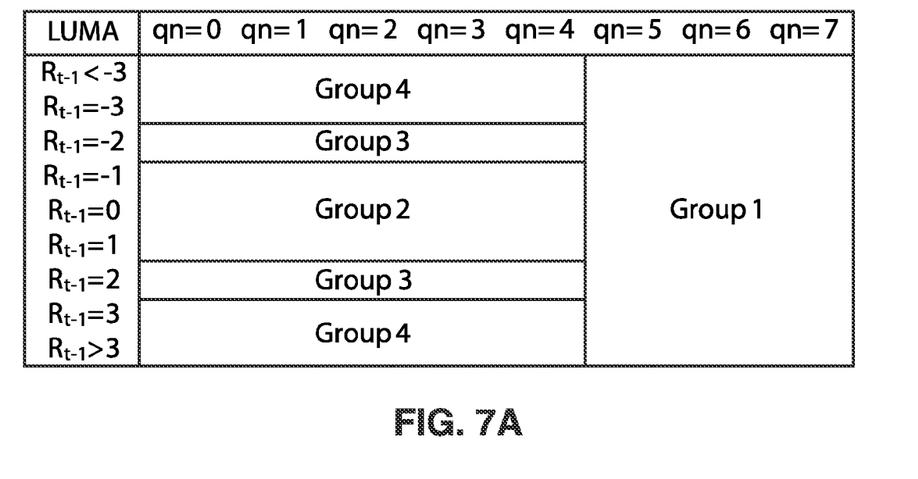
FIG. 7A and FIG. 7B are tables for input categorization of Luma and Chroma, respectively, into groups according to a first embodiment of the present technology.
Figure 7B:
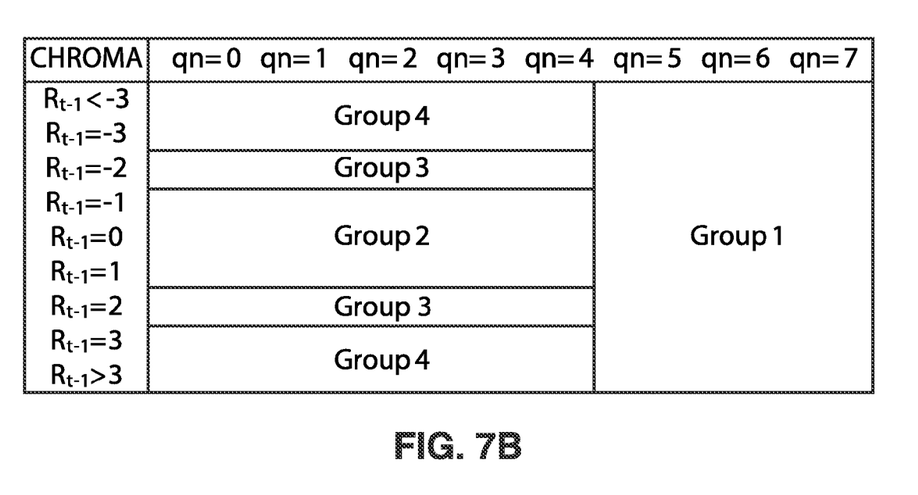

FIG. 7A and FIG. 7B illustrate an example embodiment of a first embodiment of CVLC showing two-dimensional grouping tables for Luma (FIG. 7A) and Chroma (FIG. 7B). In the table, it will be seen that the same groupings are defined for Luma and Chroma. In addition, it will be seen in that table that a plurality of groups are defined for different range combinations of qn and $R_{r-1}$. It should also be appreciated that the tables may provide different groupings for Luma and Chroma, and/or utilize other input contexts, aside from qn and $R_{r-1}$, such as including predictor type, or other context. In addition, tables may be extended beyond two dimensions for performing grouping based on more than two of the contexts.

The input context exemplified in FIG. 7A and FIG. 7B is categorized into four groups based on qn (x axis of table) and the previous residual value (y axis of table). It will be seen that Group 1 parameters are selected when qn is greater than or equal to a qn threshold, herein given as being five. Group 2 through Group 4 parameters are selected when qn is less than the qn threshold, with respect to previous residual. Thus, Group 2 parameters are selected when the absolute value of the previous residual is less than or equal to one ($|R_{r-1}| \leq 1$). Group 3 parameters are selected when the absolute value of the previous residual is equal to two ($|R_{r-1}|=1$). Group 4 parameters are selected when the absolute value of the previous residual is greater than or equal to three ($|R_{r-1}| \geq 3$). A set of progressive coding parameters are then associated with each of these groups, such that a set of progressive coding parameters can be retrieved for each group and used during VLC coding.

It should be appreciated that the above example groupings are provided by way of example and not limitation. The above parameter groupings were determined based on YUV422 8-bit data. This partitioning can be slightly different depending on the input format. Partitioning is performed by selecting $R_r$ ranges so that each individual group shares a similar distribution trend. The parameters (PGV parameters) selected for each different group are then applied when performing the progressive Golomb coding (PGC).

Figure 8A:
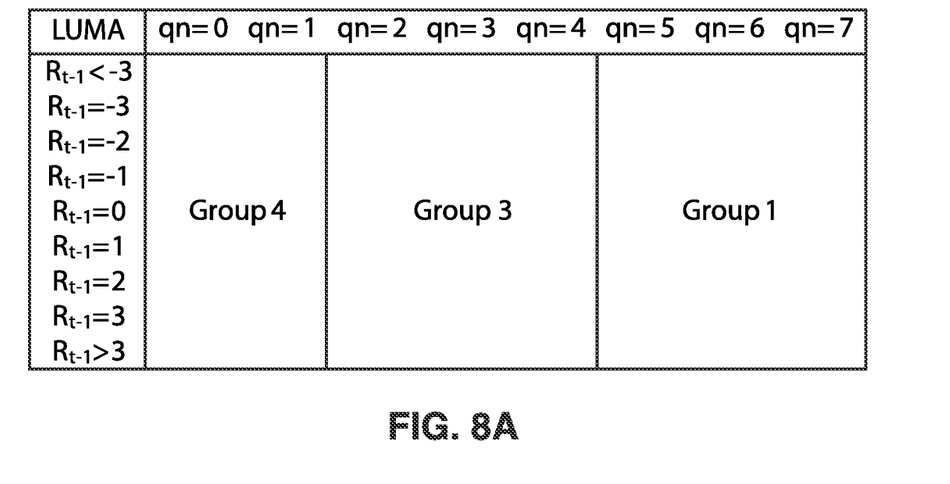
FIG. 8A and FIG. 8B are tables for input categorization of Luma and Chroma, respectively, into groups according to a first embodiment of the present technology.
Figure 8B:
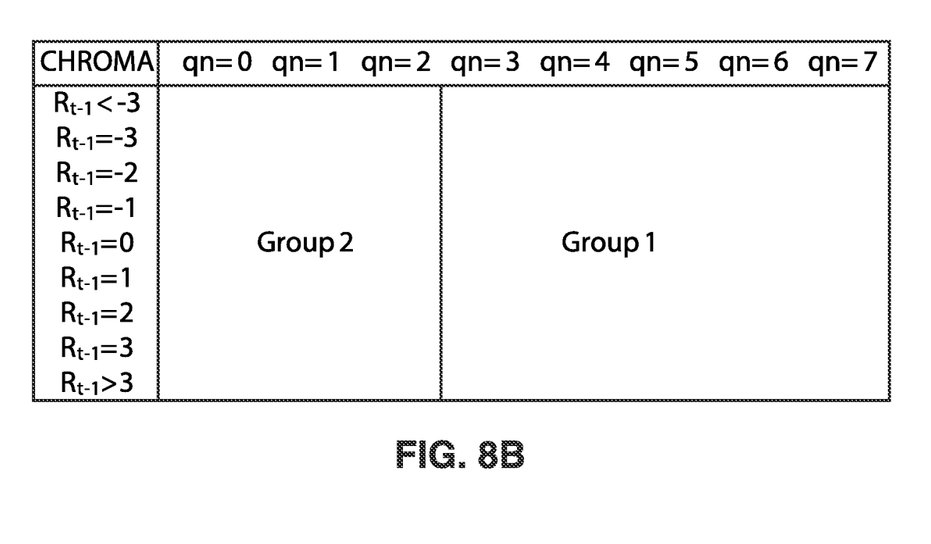

FIG. 8A and FIG. 8B illustrate an example embodiment of a second embodiment of CVLC showing grouping tables for Luma (FIG. 8A) and Chroma (FIG. 8B). In this example, the groupings differ between Luma and Chroma, thus generally considering color (Luma and Chroma) as a context. Grouping within each table is then based on a single context, such as exemplified herein by qn. It should be appreciated that the groups may be further divided or more groups created by taking $R_{r-1}$, or other contexts into account.

In this example embodiment, the groups are defined in relation to qn thresholds for Luma and Chroma. For example, Group 1 PGC parameters are selected based on a Luma qn being greater than or equal to five (qn=5), and a Chroma qn being greater than or equal to three (qn≥3). Group 2 in this example is only defined for Chroma when qn is less than three (qn<3). Group 3 in this example is only defined for Luma when qn is greater than or equal to two, and less than five (2≤qn<5). Group 4 in this example is also only defined for Luma with qn less than two (qn<2).

The above embodiment is simpler than that shown in FIG. 7A and FIG. 7B as qn is fixed per each block (not subject to previous residual), whereby the PGC parameter is only updated once per image block. By contrast, in the example shown in FIG. 7A, FIG. 7B the PGC parameter update is preferably performed for each sample because it is dependent on the previous sample value $R_{r-1}$. Again it will be appreciated that partitioning assures that contexts of the same group share similar distribution trends, and thus the same PGC parameters. It should also be appreciated, that other contexts, or additional contexts may be utilized in tables of one or more dimensions for grouping contexts which share the same PGC parameters.

It should be appreciated that the described embodiments, and similar variations can be readily implemented at a minimal overhead cost. Performance of the described embodiments was tested utilizing 29 test images from which average peak signal-to-noise ratio (PSNR) gains of 1.35 dB were obtained.

Embodiments of the present technology may be described with reference to flowchart illustrations of methods and systems according to embodiments of the technology, and/or algorithms, formulae, or other computational depictions, which may also be implemented as computer program products. In this regard, each block or step of a flowchart, and combinations of blocks (and/or steps) in a flowchart, algorithm, formula, or computational depiction can be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the block(s) of the flowchart(s).

Accordingly, blocks of the flowcharts, algorithms, formulae, or computational depictions support combinations of means for performing the specified functions, combinations of steps for performing the specified functions, and computer program instructions, such as embodied in computer-readable program code logic means, for performing the specified functions. It will also be understood that each block of the flowchart illustrations, algorithms, formulae, or computational depictions and combinations thereof described herein, can be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer-readable memory that can direct a computer or other programmable processing apparatus to function in a particular manner, such that the instructions stored in the computer-readable memory produce an article of manufacture including instruction means which implement the function specified in the block(s) of the flowchart(s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the block(s) of the flowchart(s), algorithm(s), formula(e), or computational depiction(s).

From the description herein, it will be appreciated that that the present disclosure encompasses multiple embodiments which include, but are not limited to, the following:

1. An apparatus for conditional variable length coding of image data, comprising: (a) a computer processor; and (b) programming in a non-transitory computer readable medium and executable on the computer processor for performing steps comprising: (i) selecting one group from multiple groups based on context of input distribution of image data; (ii) selecting a progressive coding parameter set for the selected one group; and (iii) performing progressive coding during variable length coding (VLC) to compress a residual in adaptive entropy coding of the image data.

2. The apparatus of any preceding embodiment, wherein said image data comprises 1D or 2D image blocks.

3. The apparatus of any preceding embodiment, wherein said conditional variable length coding of image data is utilized for compression or decompression in a lossless manner with zero error.

4. The apparatus of any preceding embodiment, wherein said conditional variable length coding of image data is configured with a resultant coded output that is still capable of being read back symbol-by-symbol.

5. The apparatus of any preceding embodiment, wherein said conditional variable length coding of image data is configured with a coding strategy that is independent and identically-distributed.

6. The apparatus of any preceding embodiment, wherein said conditional variable length coding of image data is performed during entropy coding.

7. The apparatus of any preceding embodiment, wherein said entropy coding is performed by programming executable from a non-transitory computer readable medium for computing a predictor and obtaining a difference of an input image block before quantization, which is performed prior to said conditional variable length coding of image data.

8. The apparatus of any preceding embodiment, wherein a entropy coding is performed by programming executable from a non-transitory computer readable medium for computing a predictor and obtaining a difference of an input image block after quantization, which is performed prior to said conditional variable length coding of image data.

9. The apparatus of any preceding embodiment, wherein said progressive coding is performed by programming executable from a non-transitory computer readable medium by progressive Golomb coding (PGC), in which parameters are changed depending on the context.

10. The apparatus of any preceding embodiment, wherein parameters for said progressive Golomb coding (PGC) are selected in an off-line process.

11. The apparatus of any preceding embodiment, wherein parameters for said progressive Golomb coding (PGC) are selected by programming executing on-line during entropy coding.

12. An apparatus for conditional variable length coding of image data performed during entropy coding, comprising: (a) a computer processor; and (b) programming in a non-transitory computer readable medium and executable on the computer processor for performing steps comprising: (i) selecting one group from multiple groups based on context of input distribution of image data including either 1D or 2D image blocks; (ii) selecting a progressive coding parameter set for the selected one group; and (iii) performing progressive coding during variable length coding (VLC) to compress a residual in adaptive entropy coding of the image data.

13. The apparatus of any preceding embodiment, wherein said conditional variable length coding of image data is utilized for compression or decompression in a lossless manner with zero error.

14. The apparatus of any preceding embodiment, wherein said conditional variable length coding of image data is configured with a resultant coded output that is still capable of being read back symbol-by-symbol.

15. The apparatus of any preceding embodiment, wherein said conditional variable length coding of image data is configured with a coding strategy that is independent and identically-distributed.

16. The apparatus of any preceding embodiment, wherein said entropy coding is performed by programming executable from a non-transitory computer readable medium for computing a predictor and obtaining a difference of an input image block before quantization, which is performed prior to said conditional variable length coding of image data.

17. The apparatus of any preceding embodiment, wherein a entropy coding is performed by programming executable from a non-transitory computer readable medium for computing a predictor and obtaining a difference of an input image block after quantization, which is performed prior to said conditional variable length coding of image data.

18. The apparatus of any preceding embodiment, wherein said progressive coding is performed by programming executable from a non-transitory computer readable medium by progressive Golomb coding (PGC), in which parameters are changed depending on the context.

19. The apparatus of any preceding embodiment, wherein parameters for said progressive Golomb coding (PGC) are selected in an off-line process, or in an on-line process by programming executing from a non-transitory computer readable medium during entropy coding.

20. A method of conditional variable length coding (VLC) of image data, comprising: (a) selecting one group from multiple groups based on context of input distribution of image data, as received by an image coding device; (b) selecting a progressive coding parameter set for the selected one group; and (c) performing progressive coding during variable length coding (VLC) to compress a residual in adaptive entropy coding of the image data.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. An apparatus for conditional variable length coding of image data, comprising:
  (a) a computer processor; and
  (b) programming in a non-transitory computer readable medium and executable on the computer processor for performing conditional variable length coding of image data following steps comprising:

(b)(i) categorizing an input distribution having multiple contexts, into multiple groups, for said conditional variable length coding;

(b)(ii) wherein said multiple contexts comprise at least a quantization value and either previous residual input or neighboring residual input;

(b)(iii) selecting one group of contexts for the current residual input, from multiple groups based on context of input distribution of image data;

(b)(iv) selecting a progressive coding parameter set for the selected one group;

(b)(v) performing progressive coding during variable length coding (VLC) to compress a residual in adaptive entropy coding of the image data; and (b)(vi) repeating steps (b)(iii) through (b)(v) as the current residual input changes wherein a different group of contexts and associated progressive coding parameter set are selected for adaptive entropy coding of the image data.

2. The apparatus recited in claim 1, wherein said image data comprises 1D or 2D image blocks.

3. The apparatus recited in claim 1, wherein said conditional variable length coding of image data is utilized for compression or decompression in a lossless manner with zero error.

4. The apparatus recited in claim 1, wherein said conditional variable length coding of image data is configured with a resultant coded output that is still capable of being read back symbol-by-symbol.

5. The apparatus recited in claim 1, wherein said conditional variable length coding of image data is configured with a coding strategy that is independent and identically-distributed.

6. The apparatus recited in claim 1, wherein said conditional variable length coding of image data is performed during entropy coding.

7. The apparatus recited in claim 6, wherein said entropy coding is performed by programming executable from a non-transitory computer readable medium for computing a predictor and obtaining a difference of an input image block before quantization, which is performed prior to said conditional variable length coding of image data.

8. The apparatus recited in claim 6, wherein an entropy coding is performed by programming executable from a non-transitory computer readable medium for computing a predictor and obtaining a difference of an input image block after quantization, which is performed prior to said conditional variable length coding of image data.

9. The apparatus recited in claim 1, wherein said progressive coding is performed by programming executable from a non-transitory computer readable medium by progressive Golomb coding (PGC), in which parameters are changed depending on the context.

10. The apparatus recited in claim 9, wherein parameters for said progressive Golomb coding (PGC) are selected in an off-line process.

11. The apparatus recited in claim 9, wherein parameters for said progressive Golomb coding (PGC) are selected by programming executing on-line during entropy coding.

12. An apparatus for conditional variable length coding of image data performed during entropy coding, comprising:

(a) a computer processor; and (b) programming in a non-transitory computer readable medium and executable on the computer processor for performing conditional variable length coding of image data following steps comprising:

(b)(i) categorizing an input distribution having multiple contexts, into multiple groups, for said conditional variable length coding;

(b)(ii) wherein said multiple contexts comprise at least quantization value and either previous residual input, or neighboring residual input;

(b)(iii) selecting one group of contexts for the current residual input, from multiple groups based on context of input distribution of image data including either 1D or 2D image blocks;

(b)(iv) selecting a progressive coding parameter set for the selected one group;

(b)(v) performing progressive coding during variable length coding (VLC) to compress a residual in progressive Golomb coding during adaptive entropy coding of the image data; and (b)(vi) repeating steps (b)(iii) through (b)(v) as the current residual input changes wherein a different group of contexts and associated progressive coding parameter set are selected for adaptive entropy coding of the image data.

13. The apparatus recited in claim 12, wherein said conditional variable length coding of image data is utilized for compression or decompression in a lossless manner with zero error.

14. The apparatus recited in claim 12, wherein said conditional variable length coding of image data is configured with a resultant coded output that is still capable of being read back symbol-by-symbol.

15. The apparatus recited in claim 12, wherein said conditional variable length coding of image data is configured with a coding strategy that is independent and identically-distributed.

16. The apparatus recited in claim 12, wherein said entropy coding is performed by programming executable from a non-transitory computer readable medium for computing a predictor and obtaining a difference of an input image block before quantization, which is performed prior to said conditional variable length coding of image data.

17. The apparatus recited in claim 12, wherein an entropy coding is performed by programming executable from a non-transitory computer readable medium for computing a predictor and obtaining a difference of an input image block after quantization, which is performed prior to said conditional variable length coding of image data.

18. The apparatus recited in claim 12, wherein said progressive coding is performed by programming executable from a non-transitory computer readable medium by progressive Golomb coding (PGC), in which parameters are changed depending on the context.

19. The apparatus recited in claim 12, wherein parameters for said progressive Golomb coding (PGC) are selected in an off-line process, or in an on-line process by programming executing from a non-transitory computer readable medium during entropy coding.

20. A method of conditional variable length coding (VLC) of image data, comprising:

(a) categorizing an input distribution having multiple contexts, into multiple groups, for said conditional variable length coding;

(b) wherein said multiple contexts comprise at least quantization value and either previous residual input, or neighboring residual input;

(c) selecting one group of contexts for the current residual input, from multiple groups based on context of input distribution of image data, as received by an image coding device;

(d) selecting a progressive coding parameter set for the selected one group;
(e) performing progressive coding during variable length coding (VLC) to compress a residual in adaptive entropy coding of the image data; and
(f) repeating steps (c) through (e) as the current residual input changes wherein a different group of contexts and associated progressive coding parameter set are selected for adaptive entropy coding of the image data.

\* \* \* \* \*